United States Patent
Bleyl et al.

(10) Patent No.: US 11,936,362 B2
(45) Date of Patent: Mar. 19, 2024

(54) THIN FILM SAW DEVICE

(71) Applicant: RF360 SINGAPORE PTE. LTD., Singapore (SG)

(72) Inventors: Ingo Bleyl, Munich (DE); Markus Hauser, Munich (DE); Matthias Knapp, Munich (DE)

(73) Assignee: RF360 Singapore Pte. Ltd., Republic Plaza (SG)

( * ) Notice: Subject to any disclaimer, the term of this patent is extended or adjusted under 35 U.S.C. 154(b) by 332 days.

(21) Appl. No.: 17/294,630

(22) PCT Filed: Nov. 29, 2019

(86) PCT No.: PCT/EP2019/083119
§ 371 (c)(1),
(2) Date: May 17, 2021

(87) PCT Pub. No.: WO2020/120175
PCT Pub. Date: Jun. 18, 2020

(65) Prior Publication Data
US 2021/0320642 A1 Oct. 14, 2021

(30) Foreign Application Priority Data
Dec. 12, 2018 (DE) ...................... 10 2018 131 946.0

(51) Int. Cl.
*H03H 9/02* (2006.01)
*H03H 3/08* (2006.01)

(52) U.S. Cl.
CPC .......... *H03H 9/02574* (2013.01); *H03H 3/08* (2013.01)

(58) Field of Classification Search
CPC .................................................. H03H 9/02574
See application file for complete search history.

(56) References Cited

U.S. PATENT DOCUMENTS

| 11,800,803 B2* | 10/2023 | Broekaart .......... H03H 9/02543 |
| 2015/0102705 A1* | 4/2015 | Iwamoto ............ H03H 9/02574 |
| | | 310/313 B |

(Continued)

FOREIGN PATENT DOCUMENTS

| FR | 3052298 A1 | 12/2017 |
| FR | 3053532 A1 | 1/2018 |

(Continued)

OTHER PUBLICATIONS

International Search Report and Written Opinion—PCT/EP2019/083119—ISA/EPO—dated Feb. 14, 2020.

(Continued)

*Primary Examiner* — Samuel S Outten
(74) *Attorney, Agent, or Firm* — Polsinelli

(57) ABSTRACT

A thin film SAW device comprises a carrier substrate (CA), a TCF compensating layer (CL), a piezoelectric layer (PL), and an IDT electrode (EL) on top of the piezoelectric layer. A functional layer (FL) is arranged between piezoelectric layer and TCF compensating layer to further reduce the TCF. The material properties of the functional layer match those of the piezoelectric layer in view of acoustic velocity, density and stiffness such that they do not deviate from each other by more than 10% without having piezoelectric effect. The functional layer my be of the same crystalline constitution as the useful piezoelectric layer but without piezoelectric properties.

6 Claims, 2 Drawing Sheets

(56) References Cited

U.S. PATENT DOCUMENTS

2016/0094199 A1    3/2016  David et al.
2017/0272049 A1*   9/2017  Kawachi ............ H03H 9/02007

FOREIGN PATENT DOCUMENTS

| | | | |
|---|---|---|---|
| JP | 2017532758 | A | 11/2017 |
| TW | 201334071 | A | 8/2013 |
| WO | 2017207911 | A1 | 12/2017 |
| WO | 2018163842 | A1 | 9/2018 |
| WO | 2018215152 | A1 | 11/2018 |

OTHER PUBLICATIONS

Naumenko N.F., "Multilayered Structures using Thin Plates of LiTaO3 for Acoustic Wave Resonators with High Quality Factor", Ultrasonics, vol. 88, Aug. 2018 (Aug. 2018), pp. 115-122, XP055665373, GB, abstract; figure 1.
Taiwan Search Report—TW108143571—TIPO—dated Nov. 29, 2023.

* cited by examiner

THIN FILM SAW DEVICE

Future generations of mobile communication devices require outstanding performance and properties like high electromechanical coupling factor $k^2$ and low temperature coefficient of frequency TCF.

SAW filter devices embodied on a sandwich substrate system provide per se high coupling coefficients because of providing sagittal wave guiding effect. One of the layers of a common multilayer substrate system is a $SiO_2$ layer providing a reduction of the TCF. Hence, such a $SiO_2$ layer is used as a TCF compensating layer and the thickness thereof can be adjusted to achieve a desired TCF reduction. However the compensating effect is often too small. Moreover, a higher thickness of the $SiO_2$ layer which has only poor acoustic properties leads to more spurious modes e.g. bulk acoustic modes which are undesirable for producing disturbing resonances in neighbored frequency bands that is at higher frequencies. Further, the high coupling in sandwich substrate systems may be disadvantageous for some band that require a smaller bandwidth. For these narrow bands external circuitry like capacitors are required to re-reduce the bandwidth. This in turn results in a higher area consumption which is contrary to common miniaturization requirements.

Hence, there is a need for SAW devices having a compensated TCF without enhancing the layer thickness of the $SiO_2$ layer.

This and other objects are solved by a thin film SAW device and a method of manufacture according to the independent claims. Specific features and advantageous embodiments are subject of dependent claims.

General idea is to provide a thin film SAW device comprising an additional functional layer. This may be an additional layer near or next to the piezoelectric layer of the thin film SAW device and having mechanical properties very similar to those of the piezoelectric layer. However this functional layer is not piezoelectric.

Such a layer has then outstanding acoustic properties and the acoustic wave propagates at least partly in this functional layer. Hence, due to the missing piezoelectric effect the coupling and hence, the electromechanical coupling factor $k^2$ is reduced. This is advantageous for SAW filters that are designed to operate in narrow bands respectively in bands having a narrow band width. Otherwise the band width had to be reduced with the aid of circuit elements like external capacitors that would require additional space and/or chip area. Moreover such external elements reduce the quality factor Q of the whole device in cause of their low quality factors Q. With the proposed functional layer and the thus reduced coupling factor such a circuitry is not required when designing a narrow band SAW filter.

Temperature dependence of piezoelectricity is one of the main contributors for the negative TCF of the device. The lack of the piezoelectricity of the additional functional layer leads to an improvement in TCF of the combined layer stack. Thus, the TCF that has formerly been highly negative is shifted to more positive values compared to a layer system as commonly used up to now. Hence, even in a layer system having insufficient TCF compensation this functional layer allows to improve the TCF compensation to provide a very low resulting TCF. Moreover, the functional layer allows to reduce the thickness of the usual TCF compensating layer that is a $SiO_2$ layer. Reducing the thickness of the $SiO_2$ layer having bad acoustic properties by inserting a functional layer improves the acoustic properties of the whole layer system of the thin film SAW device. As an additional advantage occurrence of spurious modes can be reduced due to lower overall layer thickness.

If desired the reduction of the coupling factor $k^2$ can be compensated by reducing the thickness of the piezoelectric layer. As a result the occurrence of spurious plate and bulk modes is further reduced.

Such a new thin film SAW device comprises a carrier substrate, a TCF compensating layer, a piezoelectric layer and electrode structures on top of the piezoelectric layer. The functional layer is arranged between piezoelectric layer and TCF compensating layer. Compared to a common thin film SAW device thickness of piezoelectric layer and TCF compensating layer can be reduced thereby achieving at least the same TCF compensation.

It is advantageous if the material properties of the functional layer match those of the piezoelectric layer in view of acoustic velocity, density and stiffness with a deviation of less than 10%.

More preferably the functional layer comprises the same material like the piezoelectric layer but shows no piezoelectric effect, e.g. due to a special thermal, mechanical, electric treatment or ion bombardment.

Such a functional layer can be formed by damaging the structure and hence the piezoelectric effect in a damage zone of a mono-crystalline piezoelectric layer. It is possible to form the damage zone by implanting ions from the top of the piezoelectric layer until a desired depth. However it is preferred to form the damage zone in a piezoelectric wafer before bonding same to the surface of multilayer substrate system. It is preferred that the damage zone is next to the surface that is bonded to the substrate system.

According to an embodiment the piezoelectric layer is a mono-crystalline layer of LT or LN and has a thickness dP. The functional layer is a crystalline layer of the same material but does not have a piezoelectric effect. For the thickness dD of the damage layer the following relation is valid:

$$0.005 dP \leq dD \leq 0.5 dP.$$

In a specific embodiment the piezoelectric layer is a monocrystalline layer of lithium tantalate LT of a thickness dP of 400 nm-700 nm. Then the functional layer is a crystalline LT layer of the same material but does not have a piezoelectric effect any more. According to the above mentioned relation the thickness dD of the damage layer then accords to $$2 \text{ nm} \leq dD \leq 350 \text{ nm}.$$

Due to the TCF reducing properties of the functional layer the thickness of the TCF compensating layer can be reduced compared to known thin film SAW devices with such a layer usually made of $SiO_2$. An exemplary thickness dC of the TCF compensating layer/$SiO_2$ layer complies with the following relation:

$$50 \text{ nm} \leq dC \leq 500 \text{ nm}.$$

In the following the thin film SAW device is explained in more detail with reference to specific embodiments and the accompanied figures.

Figure 1:
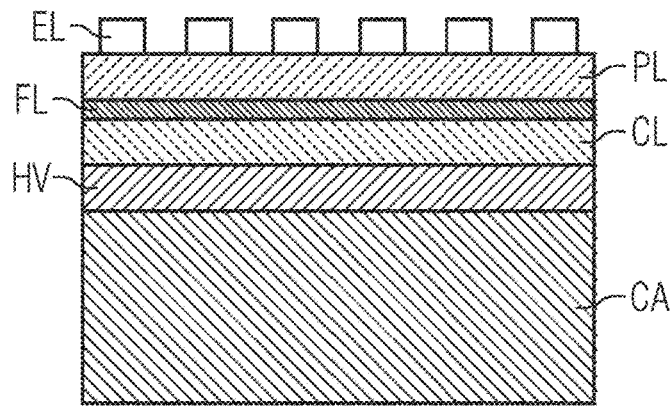
FIG. 1 shows a schematic cross section through a thin film SAW device

FIG. 1 shows a thin film SAW device in a cross sectional view. The figure is only a schematic one and not drawn to scale. For better understanding some details are depicted in enlarged form such that neither absolute nor relative dimensions can be taken from the figure.

The carrier substrate CA is preferably a wafer made of a mechanically stable rigid material. Silicon is a preferred material therefor. On top of the carrier substrate CA an optional layer may be arranged whose sound velocity is higher than $SiO_2$. The optional layer is e.g. made out of a stiff material like AlN, polycrystalline or amorphous silicon.

On this optional layer HV or directly onto the carrier substrate CA a TCF compensating layer CL of e.g. $SiO_2$ is applied. This may be done by a common PVD or CVD process. But any other deposition method is possible too. Thereupon as next layers a functional layer FL and a piezoelectric layer PL are arranged. According to the preferred embodiment arranging these two layers comprises wafer bonding of a piezoelectric wafer with an integrally formed functional layer FL on a top surface thereof to the underlying TCF compensating layer CL.

After reducing the thickness of the piezoelectric layer PL to a desired value dP electrodes EL are formed on top of the piezoelectric layer PL. The electrodes structures EL enable a function of the thin film SAW device and may comprise interdigital transducers-IDTs-reflectors, resonators or any other structure necessary for an electro-acoustic SAW device operation like a filter function.

Figure 2:
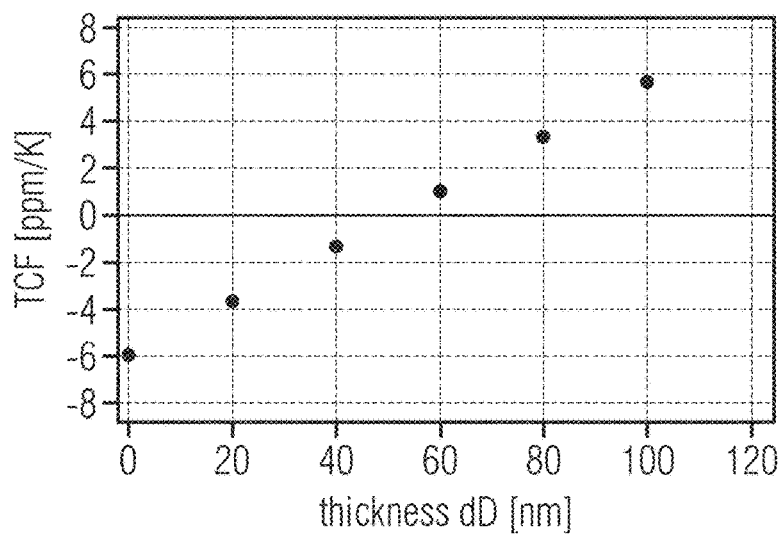
FIG. 2 shows the course of the TCF of a thin film SAW device dependent on the thickness of the functional layer

FIG. 2 shows the calculated course of the TCF of a thin film SAW device with a structure as explained above. The TCF is depicted dependent on various thicknesses dF of the functional layer FL. A first value accords to a device without functional layer FL with a thickness dF of zero. Here, the SAW device still shows a negative TCF that is due to the impact of the piezoelectric layer PL having a strong negative TCF onto the TCF of the SAW device. Already at a thickness dD of 20 nm a substantial reduction of the TCF can be regarded. A functional layer with a thickness dF of about 50 nm perfectly compensates the originally negative TCF of the device. With a higher thickness dF the TCF becomes positive. The total course is nearly linear and shows that the TCF compensating effect is proportional to the thickness of the functional layer if all other geometrical parameters of the other layer of the SAW device are kept constant. For completeness only it has to be noted that the actual values are dependent on the layer system and the thicknesses of the layers. However the dependency of the TCF on the thickness dF of the functional layer remains the same.

Due to the fact that mechanical properties that control the acoustic behavior are the same in the functional layer FL and in the piezoelectric layer a substantial amount of wave energy is concentrated in the functional layer that has no piezoelectric effect. Hence, the coupling factor is reduced compared to a SAW device without functional layer FL.

Figure 3:
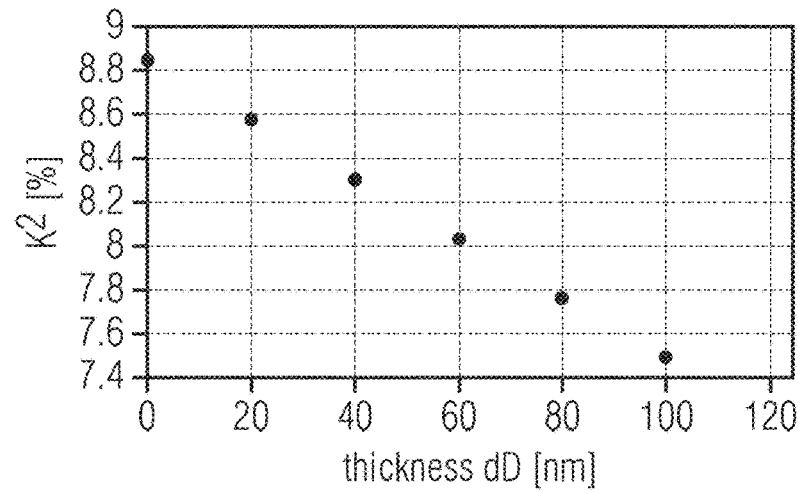
FIG. 3 shows the course of the coupling factor $k^2$ of a thin film SAW device dependent on the thickness of the functional layer

FIG. 3 shows the course of the coupling factor $k^2$ of a thin film SAW device dependent on the thickness dF of the functional layer FL. It is clear that the highest value is observed at a thickness of zero. At higher values of thickness dF the observed $k^2$ value reduces. As this dependency is also a linear one it can be used to set a desired $k^2$ for devices that require a smaller bandwidth and hence, a lower $k^2$. If according to the depicted graph a desired TCF is obtained with a thickness dF of the functional layer FL that causes a too high coupling factor $k^2$ other structural parameters of the SAW device need to be varied. Then the thickness dF of the functional layer FL has to be increased to first set a desired $k^2$. A too positive TCF can then be compensated a reduction of the thickness dC of the TCF compensating $SiO_2$, layer CL and vice versa.

The proposed SAW device allows to optimize the substrate layer system in view of a desired parameter without needing to look at the desired low or compensated TCF. First after such an optimization the TCF can be compensated by choosing an appropriate thickness dF for the functional layer. Thereby all other design features and the respective physical parameters dependent thereon can be kept constant and remain as they result from the optimization. For example geometry parameters can be set to values that are less sensitive to tolerances that are unavoidable in a manufacturing process. In known thin film SAW devices, high layer thickness dC of the $SiO_2$ layer would be required as a consequence to achieve a low TCF. However this would excite substantial amounts of acoustic bulk and plate modes and to the occurrence of undesired resonances.

Figure 4:
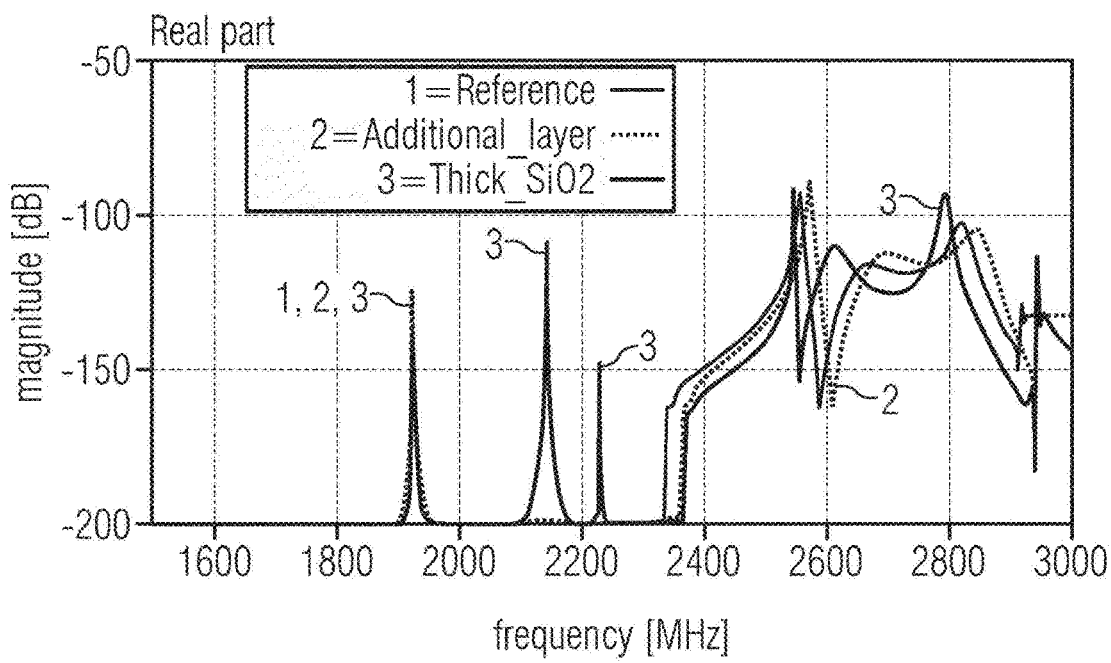
FIG. 4 shows the real part of the admittance of a thin film SAW device
Figure 5:
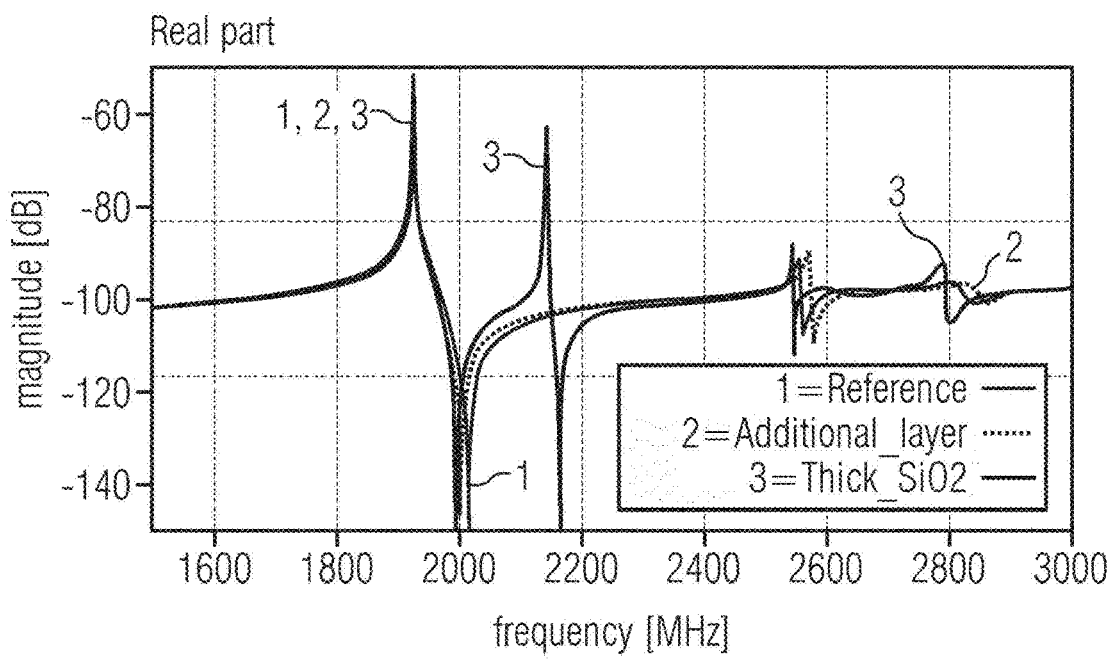
FIG. 5 shows the magnitude of the admittance of a thin film SAW device.

In the following the admittance of three devices is compared to show the positive effects of the proposed thin film SAW device embodied as a resonator. FIG. 4 shows the real part of the admittance of a thin film SAW device (while FIG. 5 shows the respective magnitude thereof. A first graph 1 is assigned to a reference SAW device according to the art that has no complete TCF compensation. A second graph 2 accords to the proposed SAW device that has been designed to achieve a complete TCF compensation. At last, graph 3 accords to SAW device without a functional layer FL that has been designed to achieve a complete TCF compensation by increasing the thickness dC of the TCF compensating $SiO_2$ layer accordingly.

For this example a layer system is chosen comprising:
Si carrier substrate
200 nm $SiO_2$
50 nm damage layer on the base of non-piezoelectric LT
600 nm piezoelectric LT
Al electrodes Graph 3 accords to a layer system complying with the one described above with the exception that no damage layer is present and that the thickness dC of the $SiO_2$ layer is increased to 400 nm which is 200 nm more than in the example above. Hence, 50 nm damage layer has about the same TCF compensating effect like 20 nm $SiO_2$ layer.

The most striking effect can be seen when comparing graph 2 according to the invention and graph 3 according to a SAW device with conventional TCF compensation. The selected examples are thin film SAW resonators that are designed for a resonance frequency of 1900 MHz. All three graphs show a maximum at this frequency. Graph 3 shows a further resonance peak that is due to an undesired spurious mode at about 2150 MHz and a lower one at 2210 MHz. The spurious modes result from the layer structure of the substrate with a relative thick $SiO_2$ layer due to the localized energy distribution of the wave and thus enables occurrence of spurious modes that are mainly bulk modes. Graph 2 does not show these peaks as best can be seen in FIG. 5.

A further positive effect can be seen at a frequency of about 2800 MHz. Here too graphs 1 and 3 show a resonance due to a further spurious mode in according conventional devices. Graph 2 however shows a peak that is substantially reduced compared to graphs 1 and 3.

When comparing the resonance and anti-resonance peaks of graphs 1 and 2 in FIG. 5 it can be seen that the pole zero distance PZD and thus the coupling factor is reduced by about 10 MHz in graph 2 according to the new design.

Hence, the new thin film SAW device provides a higher Q-factor, complete TCF compensation and substantial reduction of spurious modes. Further, the coupling is or can be reduced.

The invention is not limited by the embodiments and only defined by the claims. Hence, further variations of the shown examples are regarded to be within the scope of the invention as far as they are covered by the claims.

LIST OF REFERENCE SYMBOLS 1,2,3 admittance curves of example and references
CA carrier substrate (Si Wafer)
CL TCF compensating layer ($SiO_2$ layer)
dC thickness of the TCF compensating layer
dF thickness of the functional layer
dP thickness of the piezoelectric layer
EL IDT electrode
FL functional layer

The invention claimed is:

1. A thin film SAW device comprising:
a carrier substrate (CA);
a TCF compensating layer (CL);
a piezoelectric layer (PL); and
an IDT electrode (EL) on top of the piezoelectric layer, wherein a functional layer (FL) is arranged between piezoelectric layer and TCF compensating layer; and
wherein material properties of the functional layer match those of the piezoelectric layer in view of acoustic velocity, density and stiffness such that they do not deviate from each other by more than 10% without having piezoelectric effect.

2. The thin film SAW device of claim 1, wherein the functional layer comprises the same material like the piezoelectric layer does not provide any piezoelectric effect.

3. The thin film SAW device of claim 1, wherein the piezoelectric layer is a mono-crystalline layer of LT or LN having a thickness dP, wherein the functional layer is a crystalline layer of the same material but without having a piezoelectric effect, and wherein for a thickness dF of the functional layer the following is valid: $0.005\ dP <= dF <= 0.5\ dP$.

4. The thin film SAW device of claim 1, wherein one or more additional layer with higher sound velocity than the TCF compensating layer (CL) are added between the carrier substrate (CA) and the TCF compensating layer (CL).

5. The thin film SAW device of claim 1, wherein the piezoelectric layer is a monocrystalline layer of lithium tantalite LT of a thickness dP of 400-700 nm, wherein the functional layer is a crystalline LT layer of the same material but without having a piezoelectric effect, and wherein a thickness dF of the functional layer accords to: $2\ nm <= dF <= 350\ nm$.

6. The thin film SAW device of claim 1, wherein the TCF compensating layer (CL) comprises a SiO2 layer having a thickness dC according to: $50\ nm <= dC <= 500\ nm$.

* * * * *